US007868999B2

(12) United States Patent
Heintze et al.

(10) Patent No.: US 7,868,999 B2
(45) Date of Patent: Jan. 11, 2011

(54) LITHOGRAPHIC APPARATUS, SOURCE, SOURCE CONTROLLER AND CONTROL METHOD

(75) Inventors: Johannes Heintze, Eindhoven (NL); Erik Petrus Buurman, Veldhoven (NL); Mark Trentelman, Heeswijk-Dinther (NL)

(73) Assignee: ASML Netherlands B.V., Veldhoven (NL)

( * ) Notice: Subject to any disclaimer, the term of this patent is extended or adjusted under 35 U.S.C. 154(b) by 478 days.

(21) Appl. No.: 11/501,912

(22) Filed: Aug. 10, 2006

(65) Prior Publication Data
US 2008/0036991 A1 Feb. 14, 2008

(51) Int. Cl.
*G03B 27/54* (2006.01)

(52) U.S. Cl. .............................. 355/70; 355/67; 355/69; 372/38.1; 372/57

(58) Field of Classification Search ............. 355/67–71; 378/34, 35; 372/38.1–38.09, 57
See application file for complete search history.

(56) References Cited

U.S. PATENT DOCUMENTS

| | | | | |
|---|---|---|---|---|
| 4,771,431 A | * | 9/1988 | Nakazawa et al. | 372/38.02 |
| 5,091,744 A | * | 2/1992 | Omata | 355/53 |
| 5,097,291 A | * | 3/1992 | Suzuki | 355/69 |
| 6,741,041 B2 | * | 5/2004 | Tateishi et al. | 315/224 |
| 6,753,947 B2 | * | 6/2004 | Meisburger et al. | 355/69 |
| 7,282,666 B2 | * | 10/2007 | Agarwal et al. | 219/121.76 |
| 7,342,644 B2 | | 3/2008 | Baselmans | |
| 2005/0219493 A1 | * | 10/2005 | Oshida et al. | 355/67 |
| 2006/0114440 A1 | * | 6/2006 | Sekigawa et al. | 355/69 |

FOREIGN PATENT DOCUMENTS

| | | |
|---|---|---|
| JP | 01-191350 | 8/1989 |
| JP | 03-276782 | 12/1991 |
| JP | 2000-232249 | 8/2000 |
| JP | 2003-218437 | 7/2003 |
| JP | 2005-005407 | 1/2005 |
| JP | 2006-191063 | 7/2006 |

OTHER PUBLICATIONS

Office Action as issued for Japanese Patent Application No. 2007-203330, dated Jul. 20, 2010.

* cited by examiner

*Primary Examiner*—Hung Henry Nguyen
*Assistant Examiner*—Steven H Whitesell-Gordon
(74) *Attorney, Agent, or Firm*—Pillsbury Winthrop Shaw Pittman LLP

(57) ABSTRACT

A lithographic apparatus is disclosed that has a plurality of control circuits, each control circuit arranged to be connected to an associated radiation source of a plurality of radiation sources configured to generate pulses of radiation for projection onto a substrate and each control circuit arranged to control the energy of radiation pulses generated by that associated radiation source.

23 Claims, 3 Drawing Sheets

LITHOGRAPHIC APPARATUS, SOURCE, SOURCE CONTROLLER AND CONTROL METHOD

FIELD

The present invention relates to a lithographic apparatus, an illumination system, a controller and method for controlling pulsed sources of radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, as well as in many other applications, a surface such as a substrate (e.g., wafer) surface is illuminated by a pulsed source of radiation. The pulsed source of radiation is controlled by a controller so that successive pulses of radiation have the same energy, or have a difference in energy which falls within a predetermined tolerance. In some cases it may be desired to use more than one pulsed source of radiation to illuminate the substrate surface.

SUMMARY

It is desirable, for example, to provide a novel and inventive controller configured to control a plurality of radiation sources.

According to an embodiment of the invention, there is provided a lithographic apparatus, comprising:

a plurality of control circuits, each control circuit arranged to be connected to an associated radiation source of a plurality of radiation sources configured to generate pulses of radiation for projection onto a substrate and each control circuit arranged to control the energy of radiation pulses generated by that associated radiation source;

a substrate table configured to hold the substrate; and a projection system configured to transfer the radiation pulses as patterned onto the substrate.

According to another embodiment of the invention, there is provided a source for a lithographic apparatus, the source comprising a plurality of radiation sources arranged to generate pulses of radiation, and a plurality of control circuits, each control circuit being connected to an associated radiation source of the plurality of radiation sources and being arranged to control the energy of radiation pulses generated by that associated radiation source.

According to a further embodiment of the invention, there is provided a source controller for a lithographic apparatus, comprising a plurality of control circuits each arranged to control generation of pulses of radiation by an associated radiation source.

According to a still further embodiment of the invention, there is provided a method of controlling a plurality of radiation sources for exposing a lithographic substrate, the method comprising, for at least some of the radiation sources, determining one or more properties of those radiation sources, using the determined one or more properties to adjust values of components of an associated control circuit arranged to control each of those radiation sources, and using the control circuits to control the energy of radiation pulses generated by those radiation sources.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
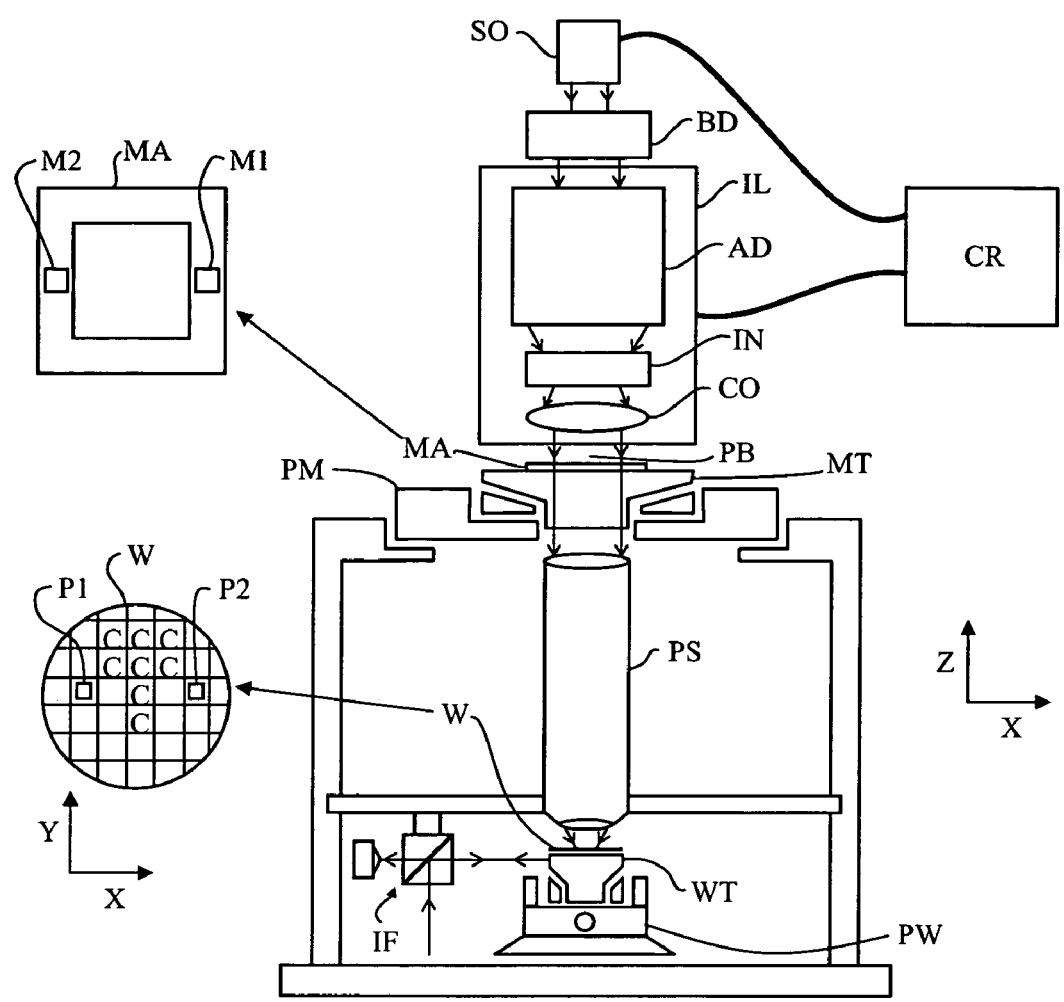
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam PB (e.g., UV radiation or any other suitable radiation), a patterning device support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam PB by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables or support structures may be used in parallel, or preparatory steps may be carried out on one or more tables or support structures while one or more other tables or support structures are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. The source SO comprises a plurality of pulsed radiation sources.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. The illuminator IL may also control the polarization of the radiation beam. The illuminator IL includes a detector (not shown) which monitors the energy of radiation pulses passing through the illuminator, and passes an output signal to a controller CR. The controller CR is configured to adjust operation of a plurality of pulsed radiation sources (which together comprise the source SO), so that they produce radiation pulses having desired energies.

The radiation beam PB is incident on the patterning device (e.g., mask) MA, which is held on the patterning device support structure (e.g., mask table) MT, and is patterned by the patterning device. Having traversed the patterning device MA, the radiation beam PB passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam PB. Similarly, the first positioning device PM and another position sensor (which is not explicitly depicted in FIG. 1) can be used to accurately position the patterning device MA with respect to the path of the radiation beam PB, e.g., after mechanical retrieval from a mask library, or during a scan. In general, movement of the patterning device support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e., a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
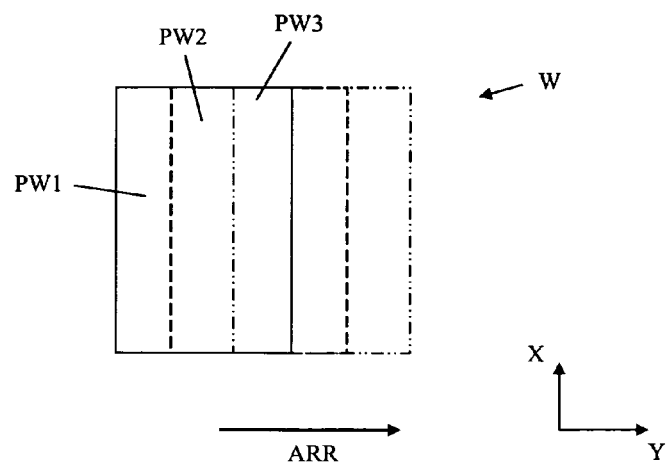
FIG. 2 schematically depicts a pulse window and a substrate.

FIG. 2 schematically depicts a top view of a part of a surface of a substrate W (or other surface of an object) which is to be illuminated, and shows a shape of consecutive radiation pulses indicated by pulse window PW1, pulse window PW2 and pulse window PW3. A direction of scanning is indicated by arrow ARR. The scanning may be performed by moving the substrate W (or other object) with respect to the pulsed source of radiation. Alternatively or additionally, the scanning may be performed by a suitable manipulation in an optical protection system such as the projection system PS indicated in FIG. 1, or by, for example, moving the pulsed source of radiation with respect to the substrate W. Since scanning is performed in the direction indicated by arrow ARR, a first pulse illuminates, for example, window PW1, a second pulse illuminates window PW2, a third pulse illuminates window PW3, etc. As shown in FIG. 2, the windows PW1, PW2, PW3 show a certain amount of overlap. In a practical implementation, more or less overlap may be present. It is, e.g., imaginable that in an embodiment of a lithographic apparatus tens of pulses overlap each other, e.g., 20; 40, 60 or 80 pulses. In the schematic representation shown in FIG. 2, an overlap of three pulses is depicted.

Although in FIG. 2 the pulse windows PW1, PW2, PW3 are shown to have a rectangular shape, any shape may be possible, such as a circular, oval, triangular, square or any other shape.

Successive radiation pulses are generated by different pulsed radiation sources. For example, there may be two pulsed radiation sources, three pulsed radiation sources, four pulsed radiation sources, or more.

Figure 3:
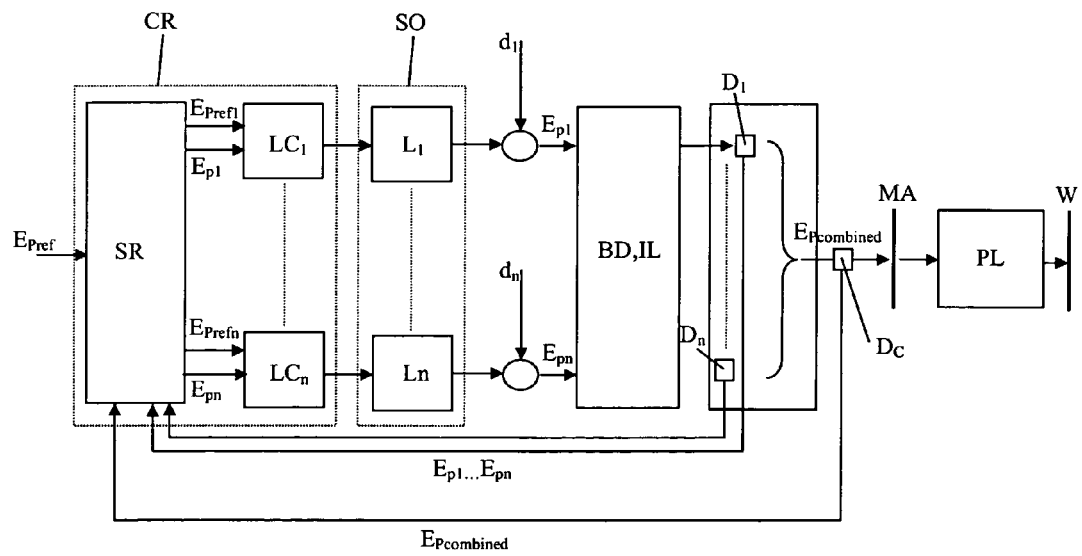
FIG. 3 schematically depicts a control diagram for the lithographic apparatus of FIG. 1.

FIG. 3 schematically depicts a control diagram of the lithographic apparatus of FIG. 1. A source SO comprises a plurality of lasers $L_1 \ldots L_n$ which each generate pulses of radiation.

The radiation pulses of each laser, which have respective energies $E_{p1} \ldots E_{pn}$, pass to a beam delivery system BD and illuminator IL (shown here as a single box for ease of illustration). The beam delivery system and the illuminator combine the pulses of radiation into a single beam. The total energy of pulses in the single beam is $E_{pcombined}$. The combined radiation beam passes traverses a patterning device MA, a projection system PL and onto a substrate W.

The illuminator IL includes a plurality of detectors $D_1 \ldots D_n$ arranged to detect the energy of pulses generated by the respective lasers $L_1 \ldots L_n$. The detectors may comprise any type of optical sensor, for example a photodiode, a photo-resistive element or a photo-conductive element. In general, the detectors may comprise any measurement devices or components which are configured to convert optical energy into a signal such as an electrical signal or optical signal. Although the detectors $D_1 \ldots D_n$ are shown as being outside of the beam delivery system BD and illuminator IL, they may, for example, be located at a suitable position within the illuminator or the beam delivery system. Outputs $E_{p1} \ldots E_{pn}$ from the detectors $D_1 \ldots D_n$ pass to a supervisory controller SR.

A separate detector $D_C$ is arranged to detect the energy of the pulses in the combined radiation beam (this is hereafter referred to as the combined detector $D_c$). The combined detector $D_C$ may be in any of the forms referred to above. An output $E_{Pcombined}$ from the combined detector $D_C$ passes to the supervisory controller SR. The supervisory controller SR is connected to a plurality of laser controllers $LC_1 \ldots LC_n$. Each laser $L_1 \ldots L_n$ is controlled by a respective laser controller $LC_1 \ldots LC_n$. The supervisory controller SR and the laser controllers $LC_1 \ldots LC_n$ together comprise the controller CR referred to above in relation to FIG. 1.

The detectors $D_1 \ldots D_n$ are not essential. The combined detector $D_C$ may be arranged such that it distinguishes between pulses generated by different lasers. This may be achieved, for example, by linking the combined detector $D_C$ to the laser controllers $LC_1 \ldots LC_n$. The link may be arranged such that the combined detector $D_C$ receives a laser controller identifying signal each time a laser controller causes the laser to emit a pulse, thereby identifying for each detected pulse the laser which generated that pulse.

The combined detector $D_C$ is not essential. For example, the signals output from the detectors $D_1 \ldots D_n$ could be combined together to provide a signal which is equivalent to that which would be output from the combined detector $D_c$.

In general, what is desired is knowledge of the pulse energies generated by each laser $L_1 \ldots L_n$, irrespective of the precise means to generate that information.

The supervisory controller SR receives a reference signal $E_{Pref}$ which indicates a desired energy per pulse. The reference signal $E_{Pref}$ may, for example, be generated by software associated with the lithographic apparatus. For example, it may have been determined, by, for example, prior experimentation, that a particular amount of energy is required to expose resist on a substrate. The reference signal $E_{Pref}$ may be set such that, during operation, the lithographic apparatus will substantially deliver this amount of energy to the substrate.

The reference signal $E_{Pref}$ may vary over time. For example, it may be the case that the projection system PS of the lithographic apparatus becomes more absorptive as it heats up, so that the amount of energy delivered to the substrate is gradually reduced. Where this is the case, $E_{Pref}$ may increase gradually to compensate for this effect (i.e. so that the amount of energy delivered to the substrate remains substantially constant).

One or more of the lasers $L_1 \ldots L_n$ may be subject to a disturbance, and such a disturbance is illustrated in the control diagram as respective inputs $d_1 \ldots d_n$. The disturbance may equivalently be thought of as a property of the laser. Although the disturbance is represented as additive in FIG. 3 this is merely for ease of illustration, and the disturbance may have another form. For example, the disturbance may include a multiplicative element, which could be caused by varying gain of the laser. A disturbance may occur at one or more locations other than the laser itself.

Each laser controller $LC_1 \ldots LC_n$ is configured to take into account one or more properties of the laser $L_1 \ldots L_n$ which it controls (and possibly another disturbance associated with the laser). The lasers may, for example, be excimer lasers, each of which may have slightly different characteristics. For example, one excimer laser may be slightly more efficient than another excimer laser, or may be more prone to drift of pulse energy due to heating than another excimer laser. Accurate control of the lasers $L_1 \ldots L_n$ is achieved by configuring each of the laser controllers $LC_1 \ldots LC_n$ to take into account one or more properties of the laser which it controls. These one or more properties may, for example, be determined during a calibration measurement, in which the output of the laser is closely monitored as a function of one or more signals input into the laser.

The supervisory controller SR is configured to compare the output signal $E_{Pcombined}$ and/or $E_{p1} \ldots E_{pn}$ to the reference signal $E_{Prefi}$ and to send an appropriate control signal $E_{Pref1} \ldots E_{Prefn}$ and $E_{p1} \ldots E_{pn}$ to the respective laser controller $LC_1 \ldots LC_n$. The one or more control signals sent by supervisory controller SR may, for example, be arranged such that each laser provides pulses of substantially the same energy, that energy corresponding with the desired energy. The supervisory controller SR may also provide one or more firing triggers (i.e. which trigger a laser to emit pulses). Alternatively, the one or more firing triggers may be provided by a separate controller.

Each laser controller $LC_1 \ldots LC_n$ controls operation of an associated laser $L_1 \ldots L_n$ such that the pulses generated by each laser have the required energy within a given acceptable accuracy. In an alternative arrangement, one or more of the lasers may be deliberately configured to generate a pulse with a different energy, for example a significantly lower energy. This is described further below. Since each laser $L_1 \ldots L_n$ has its own associated controller $LC_1 \ldots LC_n$, the energies of the pulses generated by each laser can be accurately controlled, taking into account particular properties of each laser.

Figure 4:
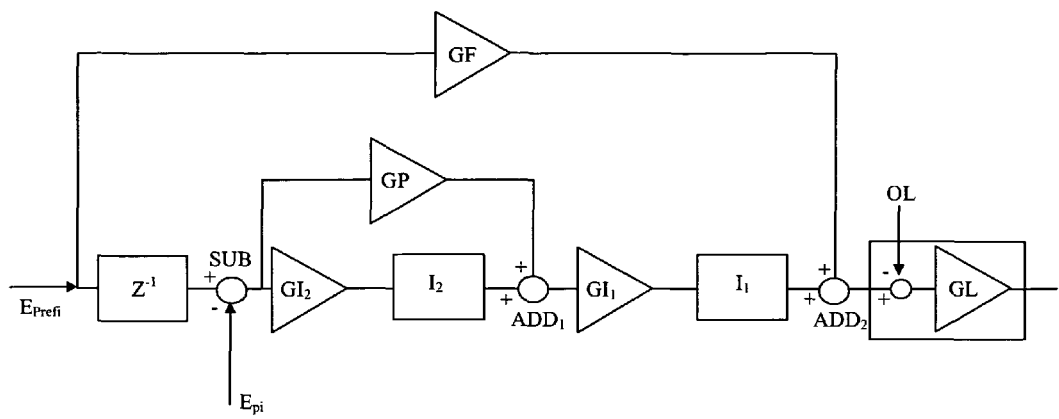
FIG. 4 schematically depicts a control diagram showing a control circuit according to an embodiment of the invention.

FIG. 4 is a control diagram which shows a laser controller. The laser controller comprises a first integrator stage $I_1$ and a second integrator stage $I_2$. A first amplifier $GI_1$ is connected in series with the first integrator stage, and a second amplifier $GI_2$ is connected in series with the second integrator stage. A bypass amplifier GP is provided which bypasses the second integrator stage $I_2$ and the second amplifier $GI_2$. An output of the bypass amplifier GP is added by an adder $ADD_1$ to an output of the second integrator stage $I_2$. The integrator stages $I_1$ and $I_2$ may each comprise a single integrator, thus each providing an integration.

The laser controller receives the measured energy $E_{pi}$ of preceding pulses generated by the laser. A reference signal $E_{Prefi}$, which is provided by the supervisory controller SR, is subjected to a time delay $Z^{-1}$. A subtractor SUB is used to subtract the measured pulse energy $E_{pi}$ from the time delayed reference signal $E_{Prefi}$. The time delay $Z^{-1}$ is arranged such that the measured pulse energy $E_{pi}$ is subtracted from the reference signal $E_{Prefi}$ which caused that pulse to be generated.

An amplifier GF is connected in parallel with the other components of the laser controller, such that the reference signal $E_{Prefi}$ may be fed forward to the output of the first integrator. An adder $ADD_2$ is arranged to subtract the signal output by the first integrator $I_1$ from the signal output by the amplifier GF.

The resulting control signal passes to an amplifier GL and an offset OL which are connected to a laser (not shown). The amplifier GL and offset OL are configured to provide high power electricity pulses to the laser as required, so that the laser may generate pulses of radiation. The amplifier GL and offset OL may be used, for example, to correct for an effect which is specific to a particular laser. This allows the configuration of the remainder of the laser controller to be tailored to effects which are seen in all of the lasers.

The power provided to the laser is dependent upon the control signal, which is derived from the reference signal $E_{Prefi}$ and the measured pulse energy $E_{pi}$ of preceding pulses. The control signal thereby keeps the laser pulses within a certain range of energies.

The control signal is dependent upon the amplification provided by the amplifiers $GI_1$, $GI_2$, GP and GF (these may have any suitable amplification factor). For example, the control signal may be a twice integrated energy error signal (i.e. the measured pulse energy $E_{pi}$ subtracted from the required pulse energy $E_{Prefi}$, twice integrated). This is provided by the series connection of the first and second integrator stages $I_1$, $I_2$ and the first and second amplifiers $GI_1$, $GI_2$.

The control signal may alternatively be a once integrated energy signal, which is provided via a path comprising the bypass amplifier GP, the first integrator $I_1$ and the first amplifier $GI_1$.

In an embodiment, the amplification may also be set to 0, and in that case the respective amplifier may be omitted. By selecting a gain for each of the amplifiers $GI_1$, $GI_2$ and GP, a mixture of once and twice integrated energy signals may be provided. When, for example, GP is set to zero, then the integrator output signal comprises a twice integrated energy signal only. In this example, $GI_1$ and $GI_2$ can be set to any, non-zero value, a gain of these amplifiers influencing a loop gain of a control loop formed by the controller and the pulsed source of radiation (see FIG. 3). When $GI_2$ is set to zero, then only the path via GP and $GI_1$ provides for an integrator output signal, the integrator output signal in that example comprising a once integrated energy signal.

The control circuit shown in FIG. 4 is configured to provide accurate control of an excimer laser. The values of the amplifiers $GI_1$, $GI_2$, GP, GF may be selected based on one or more measured parameters of the excimer laser. For example, if one or more properties of a given excimer laser are such that only a weak twice integrated energy signal is needed, then the amplifier $GI_2$ may be given a low gain and the amplifier GP may be given a higher gain.

Where a plurality of excimer lasers are used, since there is a separate control circuit for each excimer laser, the values of the amplifiers $GI_1$, $GI_2$, GP, GF may be different for each excimer laser. This allows accurate control of the operation of each laser, taking into account one or more particular properties of each laser. The configuration of each control circuit, i.e. the manner in which components are connected to one another, is the same. Only the values of the components (e.g. the amplifiers and the offset) differ from control circuit to control circuit.

Using a separate control circuit for each excimer laser allows more accurate control of each laser. For example, before it was generally the case that the only parameters which may be adjusted for each laser are the gain GL and offset OL. Typically, the gain GL and offset OL may be adjusted each time a new substrate is introduced into the lithographic apparatus (e.g. around 60-120 times per minute). An embodiment of the invention allows each laser to be controlled more accurately, using separate laser controllers $LC_1 \ldots LC_n$. In addition, the laser controllers allow the lasers $L_1 \ldots L_n$ to be controlled continuously (for example after each laser pulse), instead of merely adjusting one or more lasers after each substrate.

The values of the amplifiers $GI_1$, $GI_2$, GP, GF may take into account an effect other than that which arises from one or more properties of the respective lasers $L_1 \ldots L_n$. For example, the values of the amplifiers may take into account the interaction of the laser pulses with the substrate (e.g. whether a given location on the substrate receives 20 pulses or 80 pulses, or some other number of pulses).

At least one of the integrator stages $I_1$, $I_2$ may be a leaking integrator stage, i.e. may include some kind of decay over time. This may be done to prevent saturation or wind-up occurring. Saturation or wind-up could, for example, occur in a situation where an input to an integrator has a high value, or where the input lasts for more than an average time.

It will be appreciated that other suitable sources may be used instead of excimer lasers. Where this is done, a different control circuit configuration may be required (the term 'configuration' is intended to refer to the manner in which components of the control circuit are connected to one another). For example, a particular configuration of control circuit may be appropriate for a solid state laser, and a different configuration of control circuit may be appropriate for a discharge lamp. In some instances a particular configuration of control circuit may be appropriate for more than one type of source.

Where a plurality of sources of a given type are provided, a separate control circuit may be provided for each source. Each control circuit may have the same configuration, but the components of each control circuit may be given different values (to take into account particular properties of each source).

In use, the supervisory controller SR receives a reference signal $E_{Pref}$ which indicates a desired pulse energy. The reference signal $E_{Pref}$ may, for example, be generated by software associated with the lithographic apparatus, and may vary over time (as mentioned above). Based on this the supervisory controller SR determines the energy of pulses to be generated by each of the lasers $L_1 \ldots L_n$ (e.g. divides up $E_{Pref}$ across the different laser controllers). The supervisory controller SR may also determine the repetition rate of the lasers $L_1 \ldots L_n$, and provide one or more firing triggers, which respectively trigger a laser to emit pulses. The supervisory controller passes signals $E_{Pref}$ and $E_{pi}$, which indicate the desired pulse energy and the current pulse energy for each laser, to each laser controller $LC_1 \ldots LC_n$, together with the repetition rate. Each of the laser controllers $LC_1 \ldots LC_n$, which are already configured according to the one or more properties of each respective laser, then control the respective laser to generate pulses with the desired energy and desired repetition rate. Each laser controller $LC_1 \ldots LC_n$ operates independently of other laser controllers, based upon the reference signal $E_{Pref,i}$ and the measured energy $E_{pi}$ of pulses generated by the laser which it controls. Each laser controller $LC_1 \ldots LC_n$ only takes into account the energy of pulses $E_{pi}$ generated by the laser which it controls, and does not take into account the energy of pulses generated by other lasers.

In an alternative arrangement, the supervisory controller SR may determine the difference between the energy of the most recently generated pulse and the desired energy, and then pass a reference signal $E_{Pref,i}$ to the next laser controller $LC_i$ which includes a correction for this. This may be extended so that the reference signal $E_{Pref,i}$ includes a correction which takes account of the pulses generated by more than one preceding laser.

In a further alternative arrangement, a source may be arranged to generate pulses with an energy much lower than those generated by one or more excimer lasers. The source may, for example, be a solid state laser or a discharge lamp. The repetition rate of the source may be higher than that of the one or more excimer lasers, such that the source generates a pulse after each excimer laser generated pulse. The supervisory controller SR may receive the energy error $E_{Pref,i}$ of a pulse generated by a given excimer laser, and determine the amount of energy needed in an additional pulse to bring the total energy up to a desired level. For example, the excimer laser may be configured to generate pulses which have approximately 95% of the desired energy, and the low power source may be configured to generate a pulse which has the missing 5% of the desired energy. In an alternative arrangement, the low power source may provide the 5% (or other amount) of missing energy by providing a series of low power pulses. In a further alternative arrangement, the low power source may provide one or more low power pulses after all of the excimer lasers have emitted a pulse (providing energy which was missing from the excimer laser pulses).

The repetition rate of the low power source may be different to the repetition rate of the one or more excimer lasers. The supervisory controller SR may determine the desired repetition rate, and generate one or more firing triggers as appropriate. For example, the supervisory controller may control a low power laser such that it emits a pulse after each excimer laser pulse. Alternatively, the supervisory controller may control a low power laser such that it emits a pulse (or stream of pulses) after all of the excimer lasers have emitted a pulse. The supervisory controller may include software which determines an appropriate repetition rate for each laser.

Although the described embodiment of the invention uses excimer lasers, it will be appreciated that any other suitable laser or other source may be used.

It is advantageous if each of the lasers $L_1 \ldots L_n$ is fired in sequence. However, it is not essential that this is the case.

Figure 5:
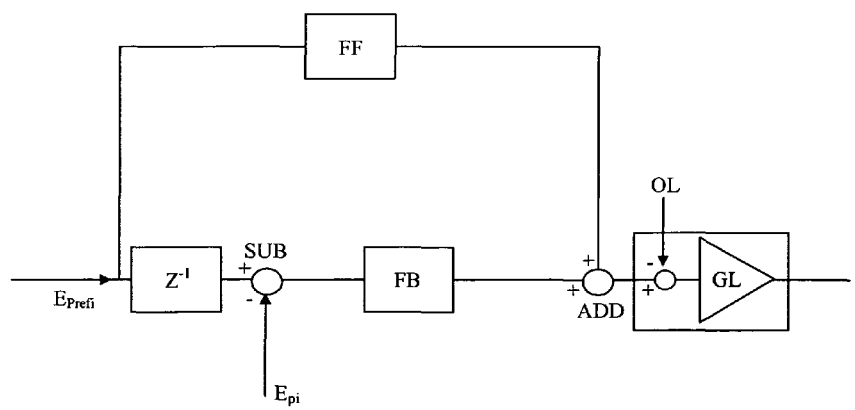
FIG. 5 schematically depicts a control diagram showing in general terms a control circuit according to an embodiment of the invention.

The control circuit shown in FIG. 4 is an example of a more general type of control circuit, which is illustrated in FIG. 5. The control circuit shown in FIG. 5 includes a feed forward component FF, and includes a feedback component FB. The feedback component includes a time delay $Z^{-1}$ which is arranged such that the fed back measured pulse energy $E_{pi}$ is synchronized with the reference signal $E_{Pref,i}$ which caused that pulse to be generated.

The feedback component FB may, for example, include a model which estimates the energy of a pulse to be generated by a laser, and compares it with the energy level of the generated pulse. This provides an estimate of one or more disturbances acting on the laser (and possibly at one or more locations other than the laser itself). The estimated disturbance(s) may be fed back via a compensator. The compensator may have different configurations, for example the compensator may be configured to calculate a moving average of the estimated error over a certain number of samples, multiplied by a certain control gain.

In general, the feedback component FB could have one of several forms, including one or two integrators, with/without bypass amplifier, a moving average of a certain error or parameter, all amplified with different control gains. The feedback component may include a filter such as a notch-filter, or a low-pass filter.

The feed forward component FF may include a model which estimates an initial transient of a pulse generated by a laser, and provides some compensation for this. The estimated initial transient may be based on previously measured initial transients.

Connections between the feed forward component FF and the feedback component FB do not have to be of the form shown in FIG. 5. The timing between the feed forward component FF and the feedback component FB may be modified.

The configuration of the control circuit (i.e. the manner in which components are connected to one another) used in a particular circumstance will depend upon the type of laser to be controlled, and other parameters of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

The above description refers to the energy of laser pulses. This may be interpreted in the conventional sense, for example that the measured energy $E_{p1}$ of a laser pulse is the total amount of energy in that pulse. Typically a detector, e.g. detector D1, will measure a small fraction of the energy of the pulse. The detector has been calibrated, so that based upon the measured fraction the total energy of the pulse may be determined. Some literature refers to dose measurements. The term 'dose' is generally used to mean the energy of a series of pulses, added together. For example, as mentioned further above 20 pulses may be used to expose an area of a substrate; the dose delivered to that area of the substrate is the sum of the energies of the 20 pulses.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a plurality of control circuits, each control circuit arranged to be connected to an associated radiation source of a plurality of radiation sources configured to generate pulses of radiation for projection onto a substrate and each control circuit arranged to control the associated radiation source such that the pulses generated by that associated radiation source have a desired energy and a desired repetition rate, wherein at least one of the control circuits comprises two integrators and an amplifier which is connected in parallel with one of the integrators;
   a support structure configured to support a patterning device, the patterning device configured to pattern the radiation;
   a substrate table configured to hold the substrate; and
   a projection system configured to transfer the radiation pulses as patterned onto the substrate, wherein the pulses of each of the plurality of radiation sources are not transferred by the projection system in respective separate paths spatially arranged across the optical axis of the projection system and, for each radiation source, at least one other radiation source generates a pulse between successive radiation pulses of that radiation source.

2. The lithographic apparatus of claim 1, wherein each control circuit includes components having adjustable values, the values being adjustable to take into account one or more particular properties of the associated radiation source.

3. The lithographic apparatus of claim 1, further comprising the plurality of radiation sources, wherein at least some of the radiation sources are of the same type, and the control circuit associated with those radiation sources has the same configuration.

4. The lithographic apparatus of claim 3, wherein the radiation sources are all excimer lasers, solid state lasers or discharge lamps.

5. The lithographic apparatus of claim 3, wherein at least one of the radiation sources is of a different type and wherein a control circuit having a different configuration is associated with the different type of radiation source.

6. The lithographic apparatus of claim 1, wherein each control circuit is connected to an input which provides a reference level.

7. The lithographic apparatus of claim 6, wherein each control circuit includes a feed forward part and a feedback part.

8. The lithographic apparatus of claim 1, further comprising a supervisory controller arranged to send signals to the control circuits which control operation of the control circuits.

9. The lithographic apparatus of claim 8, wherein the supervisory controller is arranged to cause each of the radiation sources to generate pulses with substantially the same desired energy, by sending appropriate signals to the control circuits.

10. The lithographic apparatus of claim 8, wherein the supervisory controller is arranged to cause at least one of the radiation sources to generate pulses with a desired energy less than that of pulses generated by at least one other of the radiation sources, by controlling operation of the control circuits.

11. The lithographic apparatus of claim 1, wherein at least one of the integrators is a leaking integrator.

12. A source for a lithographic apparatus, the source comprising a plurality of radiation sources arranged to generate pulses of radiation, a plurality of control circuits, each control circuit being connected to an associated radiation source of the plurality of radiation sources and being arranged to control the energy of radiation pulses generated by that associated radiation source and wherein at least one of the control circuits comprises two integrators and an amplifier which is connected in parallel with one of the integrators, and a supervisory controller arranged to send a signal to each of the control circuits regarding the energy of radiation pulses which controls operation of that control circuit to provide a certain energy of radiation pulses generated by the associated radiation source.

13. The source of claim 12, wherein each control circuit includes components having adjustable values, the values being adjustable to take into account one or more particular properties of the associated radiation source.

14. The source of claim 12, wherein at least some of the radiation sources are of the same type, and the control circuits associated with those radiation sources have the same configuration.

15. The source of claim 12, wherein the supervisory controller is arranged to cause each of the radiation sources to generate pulses with substantially the same energy, by sending appropriate signals to the control circuits.

16. The source of claim 12, wherein the supervisory controller is arranged to cause at least one of the radiation sources to generate pulses with less energy than pulses generated by at least one other of the radiation sources, by controlling operation of the control circuits.

17. A source controller for a lithographic apparatus, comprising a plurality of control circuits each arranged to control generation of pulses of radiation by an associated radiation source of a plurality of radiation sources such that the generated radiation pulses have at least a desired repetition rate, wherein at least one of the control circuits comprises two integrators and an amplifier which is connected in parallel with one of the integrators and wherein the pulses of each associated radiation source are not supplied to the lithographic apparatus for transfer by a projection system of the lithographic apparatus along respective separate paths spatially arranged across the optical axis of the projection system and, for each radiation source, at least one other radiation source generates a pulse between successive radiation pulses of that radiation source.

18. The source controller of claim 17, wherein each control circuit includes components having adjustable values, the values being adjustable to take into account one or more particular properties of the associated radiation source.

19. The source controller of claim 17, wherein the plurality of control circuits have the same configuration.

20. The source controller of claim 17, further comprising a supervisory controller arranged to send signals to the control circuits which control operation of the control circuits.

21. A method of controlling a plurality of radiation sources for exposing a lithographic substrate, the method comprising:
for at least some of the radiation sources, determining one or more properties of those radiation sources,
using the determined one or more properties to adjust values of components of an associated control circuit arranged to control each of those radiation sources, wherein at least one of the control circuits comprises two integrators and an amplifier which is connected in parallel with one of the integrators,
using the control circuits to control the energy of radiation pulses generated by those radiation sources, and
using a supervisory controller to supply a signal to each of the control circuits regarding the energy of radiation pulses to control that control circuit to provide a certain energy of radiation pulses generated by the associated radiation source.

22. The method of claim 21, wherein using the supervisory controller to control each of the control circuits comprises sending appropriate signals to the control circuits to cause each of the radiation sources to generate pulses with substantially the same energy.

23. The method of claim 21, wherein using the supervisory controller to control each of the control circuits comprises controlling operation of the control circuits to cause at least one of the radiation sources to generate pulses with less energy than pulses generated by at least one other of the radiation sources.

* * * * *